(12) United States Patent
Hiyama et al.

(10) Patent No.: US 6,653,617 B2
(45) Date of Patent: Nov. 25, 2003

(54) PHOTOELECTRIC CONVERSION DEVICE

(75) Inventors: Hiroki Hiyama, Kanagawa (JP); Toru Koizumi, Kanagawa (JP); Katsuhito Sakurai, Tokyo (JP); Fumihiro Inui, Kanagawa (JP); Masaru Fujimura, Kanagawa (JP); Tomoko Eguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 21 days.

(21) Appl. No.: 09/897,033

(22) Filed: Jul. 3, 2001

(65) Prior Publication Data

US 2002/0024001 A1 Feb. 28, 2002

(30) Foreign Application Priority Data

Jul. 3, 2000 (JP) ........................................ 2000-201064

(51) Int. Cl.[7] .............................................. H01L 31/00
(52) U.S. Cl. ................. 250/214.1; 250/208.1; 257/435
(58) Field of Search ....................... 250/208.1, 578, 250/211, 214.1, 214 LA, 214 LS, 216; 257/431–435, 291; 358/496, 475

(56) References Cited

U.S. PATENT DOCUMENTS

| | | | |
|---|---|---|---|
| 4,879,470 A | 11/1989 | Sugawa et al. | 250/578 |
| 5,081,347 A | 1/1992 | Matsumoto | 250/211 |
| 5,101,252 A | 3/1992 | Matsumoto | 357/30 |
| 5,124,544 A | 6/1992 | Ohzu | 250/211 |
| 5,200,639 A | 4/1993 | Ishizuka et al. | 257/508 |
| 5,214,272 A * | 5/1993 | Ueno | 250/208.1 |
| 5,736,756 A * | 4/1998 | Wakayama et al. | 257/223 |
| 6,002,287 A | 12/1999 | Ueno et al. | 327/307 |
| 6,169,317 B1 | 1/2001 | Sawada et al. | 257/435 |
| 6,188,094 B1 | 2/2001 | Kochi et al. | 257/232 |

* cited by examiner

Primary Examiner—David Porta
Assistant Examiner—Patrick J. Lee
(74) Attorney, Agent, or Firm—Fitzpatrick, Cella, Harper & Scinto

(57) ABSTRACT

A photoelectric conversion device having a substrate, a light reception area formed on a surface of the substrate, the light reception area having at least one unit pixel, an insulating layer formed on the substrate including the light reception area, and a light shielding group made of a plurality of light shieldings and formed through the insulating layer along a direction perpendicular to the substrate, the light shielding group surrounding the light reception area.

10 Claims, 9 Drawing Sheets

PHOTOELECTRIC CONVERSION DEVICE

BACKGROUND OF THE INVENTION

1. Field of the Invention

The present invention relates to a photoelectric conversion device, and more particularly to a photoelectric conversion device suitable for use with scanners, video cameras, digital still image cameras.

2. Related Background Art

If incidence light oblique to the substrate of a photoelectric conversion device reaches a photoelectric conversion area directly or in multiple reflection, there arises a problem of malfunction or image deterioration. For example, in a photoelectric conversion device made of a plurality of unit pixels disposed in two-dimensionally, if oblique incidence light to some pixel enters adjacent pixels directly or in multiple reflection, there arise problems of degraded resolution and the like. It is therefore desired to prevent light leakage by forming a light shielding region or a light absorption region between adjacent pixels.

In forming a photoelectric conversion device having a number of fine unit pixels, such as an image pickup photoelectric conversion device, it is desired to reduce the ratio of the area occupied by a light shielding region in each unit pixel. This is because the smaller the area of a light shielding region in each unit pixel, the area ratio (hereinafter called an opening ratio) of the photoelectric conversion area in each unit pixel can be made larger so that a light sensitivity can be prevented from being lowered.

FIG. 8A shows the structure similar to that of a photoelectric conversion device described in JP-A-4-91472. In FIG. 8A, reference numeral 20 represents a semiconductor substrate, reference numeral 21 represents an $n^+$-type buried layer, reference numeral 22 represents an $n^-$-type epitaxial layer, reference numeral 23 represents an $n^+$-type element separation region, reference numeral 24 represents a photoelectric conversion region constituting a dark pixel, reference numeral 25 represents a light shielding for preventing light from entering the photoelectric conversion region from the upper side or oblique upper side, and reference numeral 26 represents an insulating layer.

The upper area and upper peripheral area of the photoelectric conversion region 24 surrounded by the $n^+$-type buried layer 21 and $n^+$-type element separation region 23 are covered with the light shielding 25. Since incidence light from the upper side and oblique upper side can be shielded, the photoelectric conversion region 24 of the dark pixel can output a dark current always stably without being influenced by the external light state.

FIG. 8B is a schematic top view of another photoelectric conversion device. In FIG. 8B, reference numeral 41 represents an anode of a photodiode constituting a photoelectric conversion region, reference numeral 42 represents a cathode, reference numeral 43 represents a light shielding for preventing oblique light from being entered, and reference numeral 50 represents a contact hole connected to a transistor constituting a unit pixel. In order to make finer a unit pixel constituted of at least the photoelectric conversion region 41 and contact hole 50 and not to lower the opening ratio, it is desired to form the contact hole 50 and light shielding 43 as near as possible. However, if the light shielding 43 and contact hole 50 are formed near at each other to make the pixel finer, by photolithography using a phase shift method and anisotropic etching, diffraction light applied to mask patterns for the light shielding 43 and contact hole 50 may cause interference and desired resist patterns may not be formed. From this reason, it is necessary to broaden a space therebetween or to form the light shielding 43 and contact hole 50 not by the same process but by different processes.

However, if a space between the light shielding 43 and contact hole 50 is made large, the opening ratio lowers opposing the current tendency of making a unit pixel finer.

SUMMARY OF THE INVENTION

It is an object of the invention to provide a photoelectric conversion device capable of suppressing deterioration of a resolution to be caused by incidence of oblique light and/or multiple reflection light into a photoelectric conversion region.

It is another object of the present invention is to provide a photoelectric conversion device capable of forming a light shielding and a contact hole near at each other.

According to one aspect of the invention, there is provided a photoelectric conversion device comprising: a substrate; a light reception area formed on a surface of the substrate, the light reception area having at least one unit pixel; an insulating layer formed on the substrate including the light reception area; and a light shielding group made of a plurality of light shieldings and formed through the insulating layer along a direction perpendicular to the substrate, the light shielding group surrounding a unit pixel or the light reception area.

DETAILED DESCRIPTION OF THE PREFERRED EMBODIMENTS

<First Embodiment>

Figure 1A:
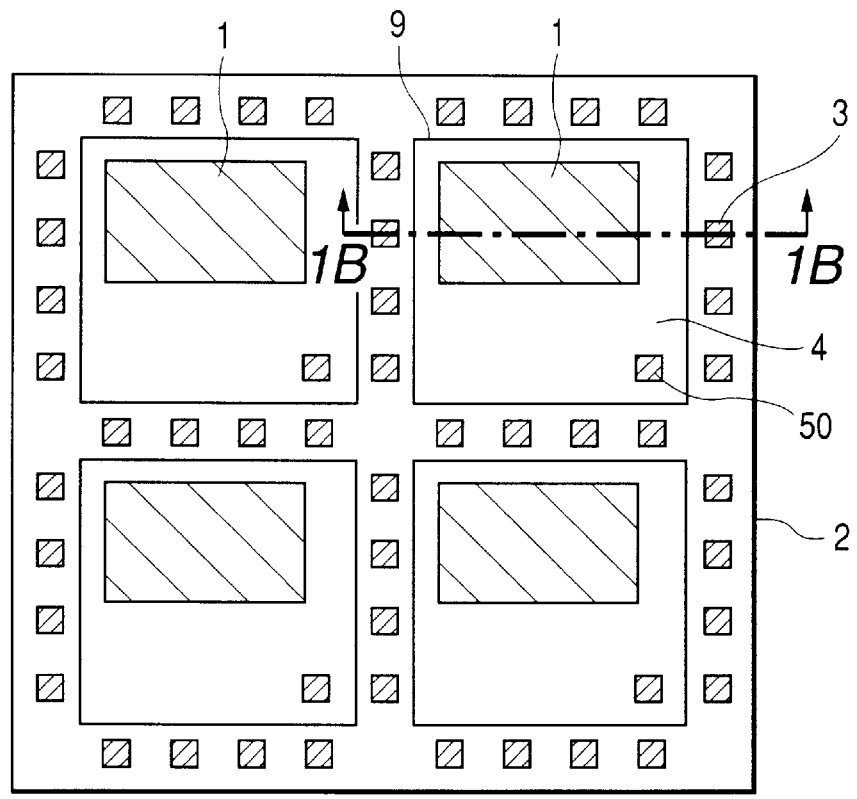
FIG. 1A is a top view showing a photoelectric conversion device according to a first embodiment of the invention.
Figure 1B:
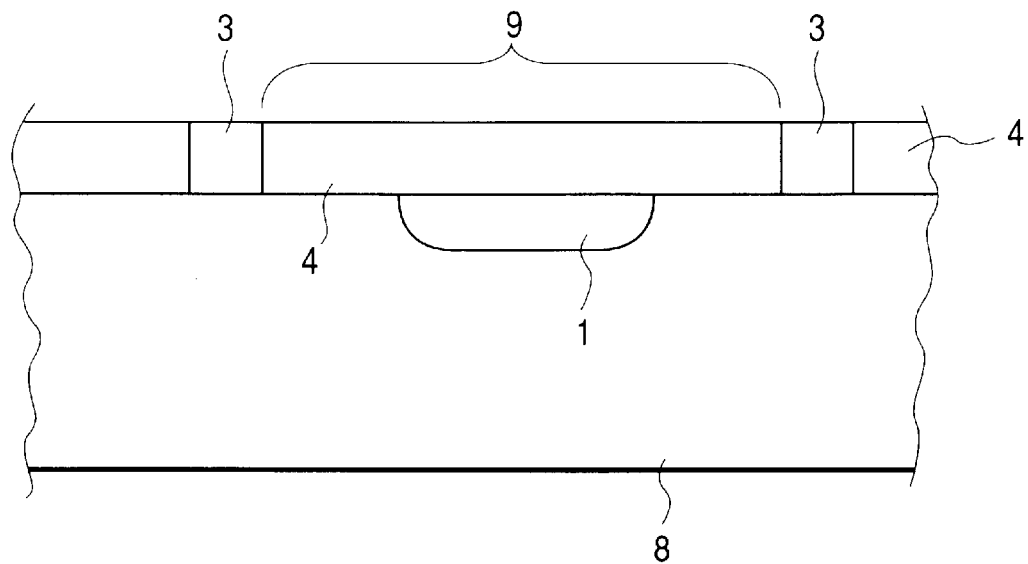
FIG. 1B is a cross sectional view taken along line 1B—1B shown in FIG. 1A.

FIG. 1A is a top view showing a photoelectric conversion device according to the first embodiment of the invention, and FIG. 1B is a cross sectional view taken along line 1B—1B shown in FIG. 1A.

Reference numeral 1 represents a photoelectric conversion region for converting incidence light into an electric signal, reference numeral 8 represents a p-type semiconductor substrate, reference numeral 4 represents an insulating layer formed on the p-type semiconductor substrate 8 with the photoelectric conversion region 1, reference numeral 3 represents a light shielding formed through the insulating layer 4 along a direction perpendicular to the p-type semiconductor substrate 8, reference numeral 2 represents a light shielding group having a plurality of analogous light shieldings 3 formed through the insulating layer 4 in the peripheral area of the photoelectric conversion region 1, and reference numeral 9 represents a unit pixel. Region of a unit pixel 9 comprises of a photoelectric conversion region 1 and a contact hole 50. In this example, light reception area is formed of plurality of unit pixels 9 (example shown in FIG. 1A, four pixels are shown as a plurality of unit pixels 9 as an example).

In this example shown in FIG. 1A, four pixels are shown which are part of a plurality of unit pixels 9 of the photoelectric conversion device disposed two dimensionally on the substrate. However, this embodiment is also applicable to an occasion which one unit pixel 9 is surrounded by the light shielding groups 2. In this embodiment, the unit pixel 9 has, in a peripheral area of the photoelectric conversion region 1, a contact hole 50 for interconnecting a MOS transistor (not shown) and a control line (not shown) and the like for driving the MOS transistor.

The light shielding 3 of this embodiment can be formed by a method of forming a fine contact hole or through hole by using LSI manufacture processes for the minimum size of 0.35 µm near the i-ray resolution limit. For example, as described in "96 Latest Semiconductor Process Technologies", at pp. 53 and 59, published on Sep. 8, 1995 by Press Journal Company, an insulating layer is planarized by chemical mechanical polishing (CMP), a fine hole is formed through the insulating layer 4 by photolithography using a phase shift method and anisotropic etching, and refractory metal or the like is filled in this hole.

According to the embodiment, the light shielding groups 2 each constituted of a plurality of light shieldings 3 formed by the micro fine patterning process can suppress incidence of oblique light and/or multiple reflection light to the photoelectric conversion region 1.

In addition, according to the embodiment, the contact hole 50 to be formed by i-rays and a phase shift method and the light shielding 3 can be formed by the same process while the space therebetween is set nearer to each other.

In this embodiment, each unit pixel 9 is surrounded by the light shielding groups 2. Namely, a plurality of light shieldings are disposed along a boundary between adjacent unit pixels 9. It is therefore possible to reduce propagation of oblique light between adjacent unit pixels 9 and to prevent the resolution from being lowered by the influence of oblique light. Furthermore, the light shielding group 2 constituted of a plurality of light shieldings 3 is formed to have a size near to the i-ray resolution limit, so that the width of the light shielding is narrower than a conventional light shielding. The light reception area can be broadened correspondingly so that the opening ratio can be improved.

In this embodiment, although a plurality of light shieldings 3 surrounding the unit pixel 9 are formed at the same pitch, i.e., periodically, the light shieldings 3 are not required to be formed periodically.

Also in this embodiment, although a conductive light shielding is used, an insulating light shielding may also be used. For example, opaque resin which absorbs light, such as organic resin containing pigment may also be used.

<Second Embodiment>

Figure 2A:
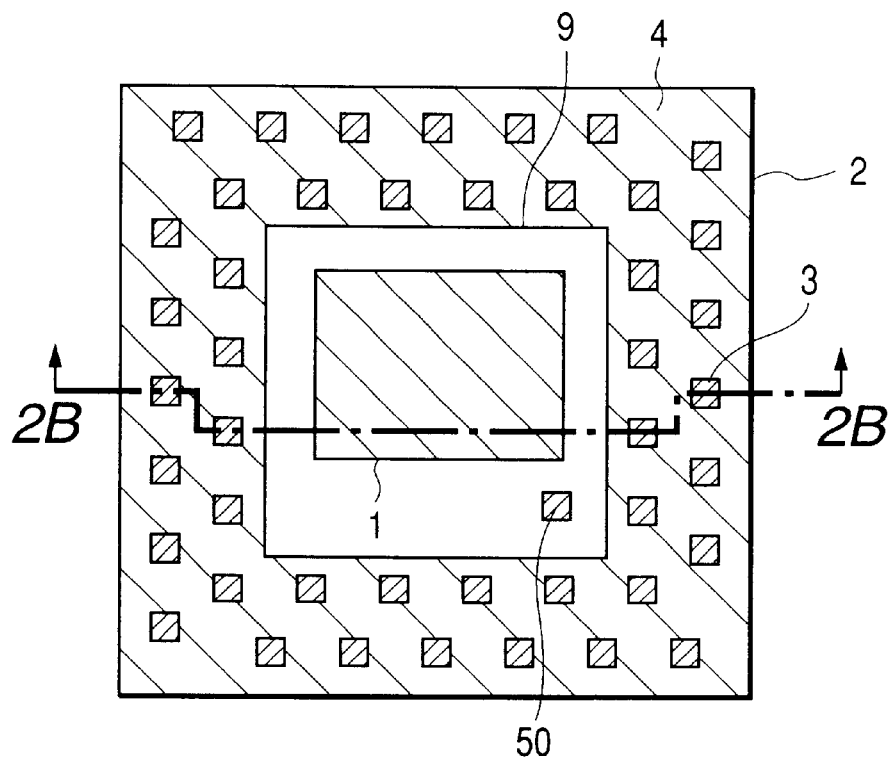
FIG. 2A is a top view showing a photoelectric conversion device according to a second embodiment of the invention.
Figure 2B:
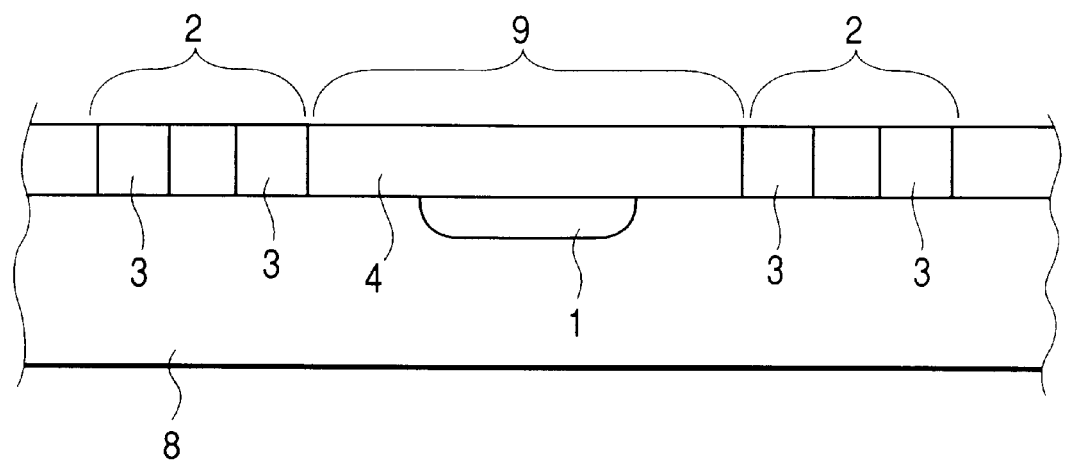
FIG. 2B is a cross sectional view taken along line 2B—2B shown in FIG. 2A.

FIG. 2A is a top view showing a photoelectric conversion device according to the second embodiment of the invention, and FIG. 2B is a cross sectional view taken along line 2B—2B shown in FIG. 2A. The description of elements having identical reference numerals is omitted. A light shielding 3 of this embodiment is formed by a method similar to the first embodiment.

Different points from the first embodiment reside in that two trains of light shieldings are formed surrounding a unit pixel 9 and that a plurality of light shieldings 3 are disposed periodically to form a light shielding train. At the positions corresponding to the intermediate positions between the light shieldings 3 of the inner light shielding train, outer light shieldings 3 are disposed, i.e., the inner and outer light shielding trains are disposed shifted by a half phase. If only one light shielding train is disposed in the light shielding group 2 as in the first embodiment, light passes between adjacent light shieldings 3. Therefore, in order to further improve the light shielding ability, it is effective to dispose a plurality of light shielding trains by changing their phases.

The light shielding 3 of this embodiment has the effect of reflecting and/or absorbing oblique light. A plurality of light shielding trains each constituting of light shieldings disposed periodically at a predetermined pitch are disposed by changing their phases, so that the light shielding effect for oblique light can be improved in total.

Figure 3:
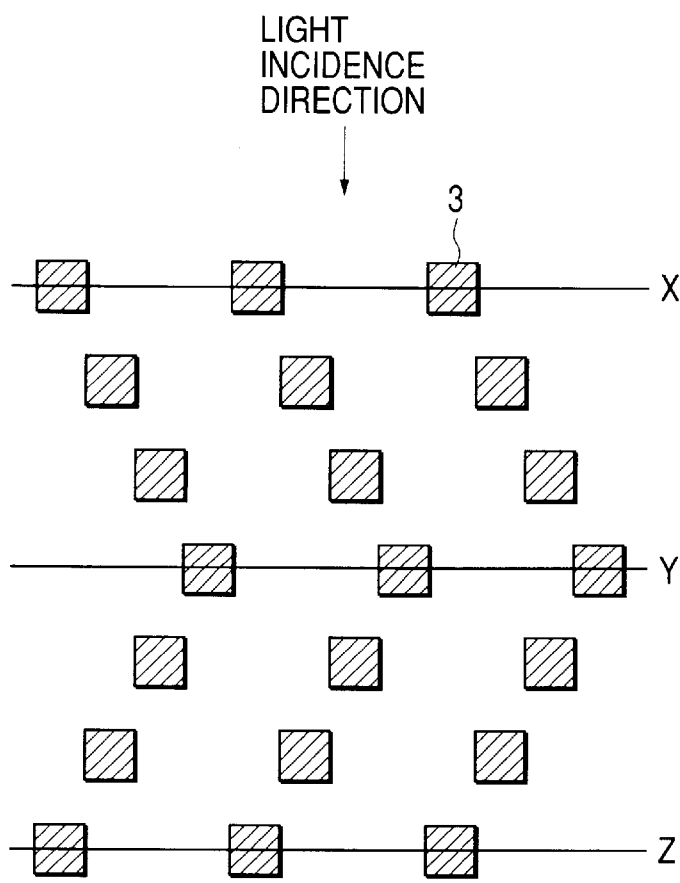
FIG. 3 is a diagram showing another example of the layout of light shieldings 3 of a light shielding group 2.

FIG. 3 shows another example of a layout of an oxidation group 2 constituted of a plurality of light shieldings 3. Between X and Y, the light shieldings 3 are disposed by shifting them by a quarter phase. With this layout, the light shielding ability is weak relative to light incidence at a specific angle. Therefore, between Y and Z, the phase shift direction of light shieldings is reversed to improve the total light shielding ability. It is effective particularly for the improvement of the light shielding effect to juxtapose a plurality of light shieldings having different periodicity.

However, although the light shielding ability improves more as the number of juxtaposed light shieldings having different periodicity increases, the area occupied by the shielding area of the photoelectric conversion device increases and the light sensitivity is lowered. From this reason, the actual area of the light shielding area is determined by considering a balance between the light shielding ability and opening ratio. Furthermore, this embodiment is also applicable to an occasion wherein one unit pixel 9 is surrounded by the light shielding groups 2.

<Third Embodiment>

Figure 4:
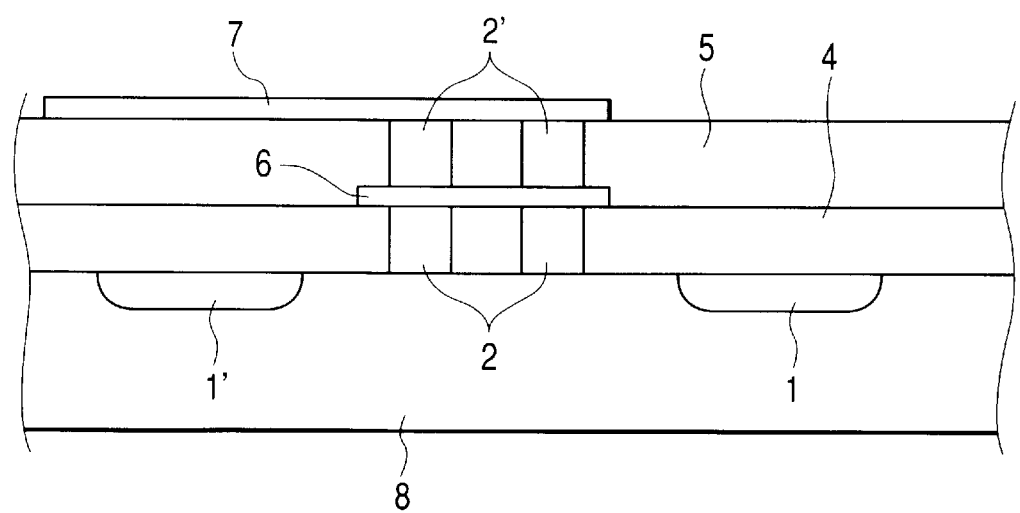
FIG. 4 is a cross sectional view of a photoelectric conversion device according to a third embodiment of the invention.

FIG. 4 is a cross sectional view showing a photoelectric conversion device according to the third embodiment of the invention. Reference numeral 6 represents a first conductive wiring layer formed on an insulating layer 4 formed on a substrate having a photoelectric conversion region 1, reference numeral 5 represents a second insulating layer formed on the first wiring layer 6, and reference numeral 7 represents a second conductive wiring layer formed on the second insulating layer 5. The description of elements having identical reference numerals is omitted. Although light shielding groups 2 and 2' are not shown, light shieldings 3 and 3' are disposed regularly along a direction perpendicular to the drawing sheet. The light shielding group 2 and first wiring layer 6 as well as the light shielding group 2' and second wiring layer 7 may be formed by the same process by using a dual damascene method.

In this embodiment, photoelectric conversion regions 1 and 1' are formed in a surface layer of a p-type semiconductor substrate 8. Of these, the photoelectric conversion region 1' is shielded from light in the upper area by the second wiring layer 7 and is used as a dark pixel for outputting a reference dark output. The upper area of the photoelectric conversion region 1 is opened and this region 1 is used as an effective pixel for outputting a signal corresponding to a light intensity of incidence light.

A method of forming the light shielding group 2 of this embodiment is similar to the first and second embodiments.

A feature of this embodiment resides in that the light shielding groups 2 and 2' are disposed in the respective insulating layers 4 and 5 stacked upon a p-type semiconductor substrate 8. In a lamination structure having a number of wiring layers as in this embodiment, oblique light exists which propagates through multiple reflection at different wiring layers. It is therefore effective to dispose the light shielding group in each insulating layer. In this case, it is effective to dispose respective light shieldings of light shielding groups in different insulating layers by superposing them along a vertical direction, in order to reduce the size of the light shielding group. For example, as in this embodiment, by superposing the light shieldings 2 and 2', the width of the light shielding group can be minimized.

In this embodiment, the light shielding groups 2 and 2' shield oblique light incident from the effective pixel side, and a fluctuation of a dark reference output can be avoided which might otherwise be caused by oblique light entered the photoelectric conversion region 1' serving as the dark pixel.

<Fourth Embodiment>

Figure 5:
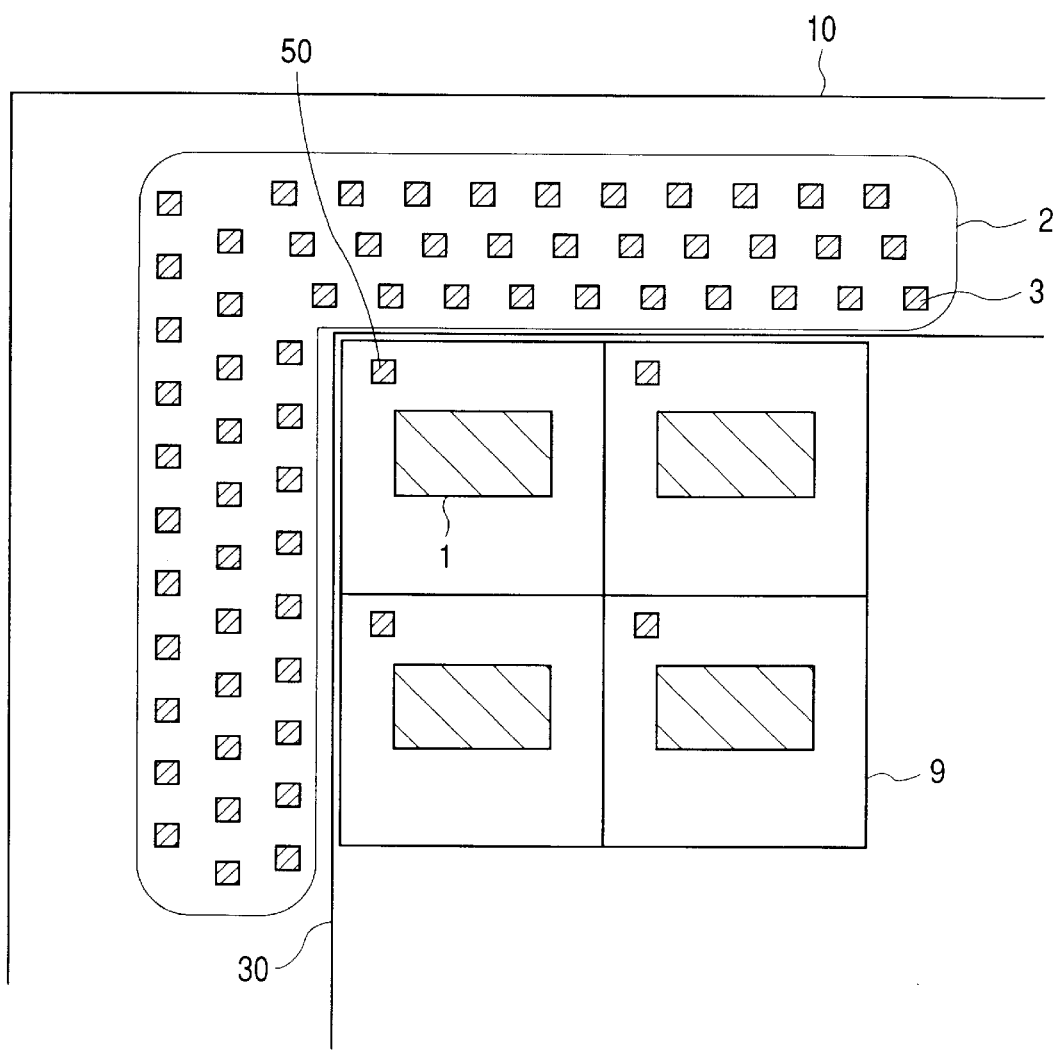
FIG. 5 is a top view of a photoelectric conversion device according to a fourth embodiment of the invention.

FIG. 5 is a top view of a photoelectric conversion device according to the fourth embodiment of the invention. Reference numeral 10 represents one side of a p-type semiconductor substrate 8, and reference numeral 30 represents a light reception area constituted of a plurality of unit pixels 9 including a photoelectric conversion region 1 disposed two-dimensionally on the substrate. In FIG. 5, four pixels are shown among a plurality of unit pixels 9 disposed two dimensionally on the substrate of the photoelectric conversion device having a pixel area. The description of elements having identical reference numerals is omitted.

As different from the above-described first to third embodiments, in this embodiment a light shielding group 2 is not formed for each unit pixel 9, but a light shielding group 2 is formed surrounding the light reception area 30 constituted of a plurality of unit pixels 9 disposed two-dimensionally on the substrate.

The unit pixels 9 of this embodiment may include dark pixels for outputting a dark reference output, although not shown. As the layout of dark pixels, all unit pixels 9 in the outermost train in the light reception area 30 may be used as dark pixels. By disposing the dark pixels in the peripheral area of the effective pixels, the dark pixels and light shielding group 2 of the embodiment provide the light shielding effect for oblique light to become incident upon the effective pixels.

However, the number of dark pixels to be disposed in the light reception area is increased more, the number of effective pixels for outputting a signal corresponding to a light intensity of incidence light is decreased. Therefore, by considering a balance between effective pixels and dark pixels for outputting a dark reference output, it is effective to dispose dark pixels along one side among four sides constituted of outermost unit pixels 9 in the light reception area 30 and along one side perpendicular to the aforementioned one side. In this case, it is not necessary to use all unit pixels along one side as the dark pixels, but some of the unit pixels along one side may be used as dark pixels, or dark pixels along one side may be disposed periodically.

A method of forming the light shielding group 2 constituted of a plurality of light shieldings of this embodiment is similar to that of the above-described embodiments. In this embodiment, three light shielding trains are formed by shifting them by a quarter phase relative to an inner light shielding train.

In this embodiment, the light shielding group 2 is not formed between adjacent unit pixels 9. Therefore, the opening ratio can be improved, and oblique light entered near at the substrate side 10 can be shielded by the light shielding group 2 and will not reach the light reception area 30. It is therefore possible to solve the problem such as ghost to be formed by oblique light entered near at the substrate side 10.

As the light shielding group 2, light shieldings such as shown in FIGS. 3 and 4 may be used.

<Fifth Embodiment>

Figure 6A:
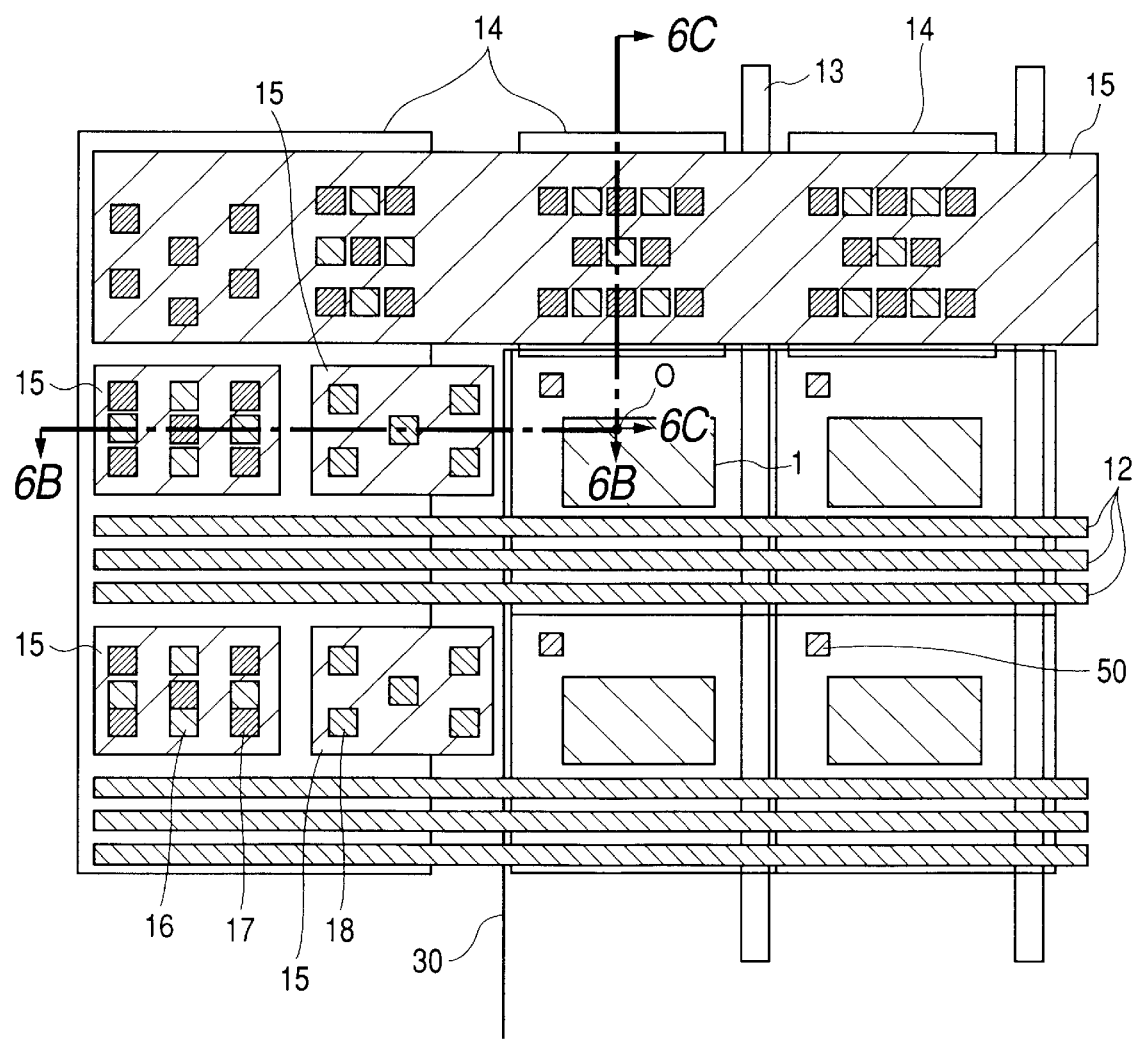
FIG. 6A is a top view of a photoelectric conversion device according to a fifth embodiment of the invention.
Figure 6B:
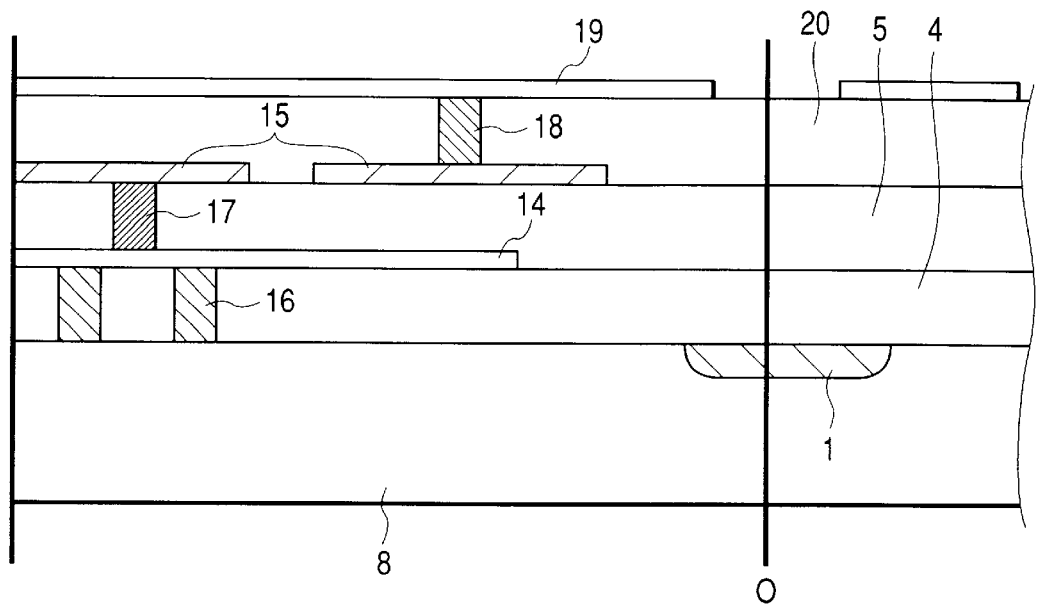
FIG. 6B is a cross sectional view taken along line 6B—6B shown in FIG. 6A.
Figure 6C:
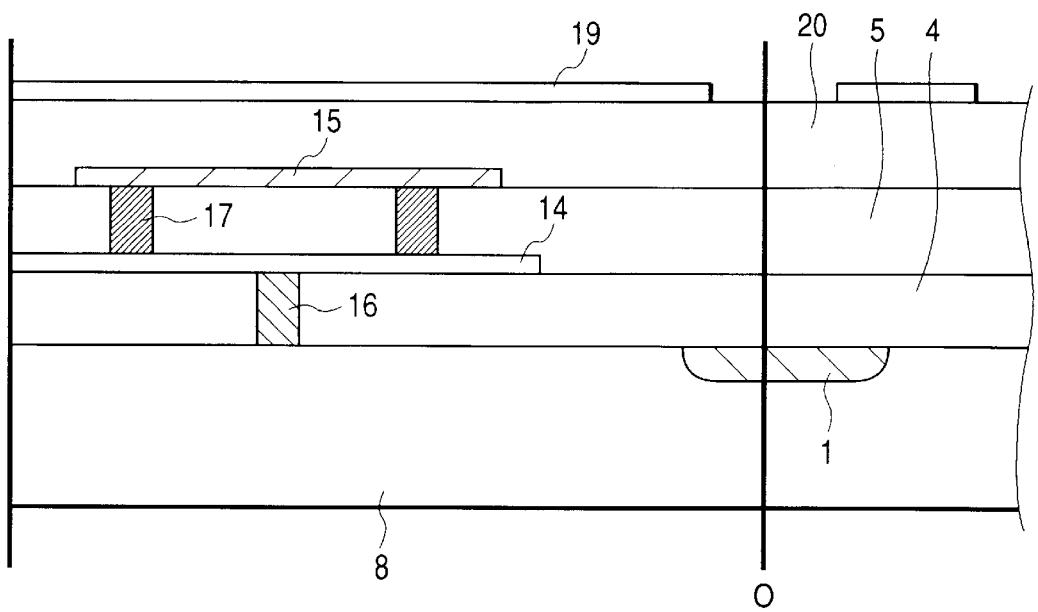
FIG. 6C is a cross sectional view taken along line 6C—6C shown in FIG. 6A.

FIG. 6A is a top view of a photoelectric conversion device according to the fifth embodiment of the invention, FIG. 6B is a cross sectional view taken along line 6B—6B shown in FIG. 6A, and FIG. 6C is a cross sectional view taken along line 6C—6C shown in FIG. 6A. Reference numeral 12 represents control signal lines for controlling the operation of a MOS transistor in each unit pixel 9, reference numeral 13 represents output signal lines for outputting an output signal from each unit pixel 9 to the external, reference numeral 14 represents a first conductive wiring layer, reference numeral 15 represents a second conductive wiring layer, reference numeral 19 represents a third conductive wiring layer formed on a layer above the second conductive wiring layer 15, reference numeral 16 represents a conductive light shielding formed between a p-type semiconductor substrate 8 and the first wiring layer 14, reference numeral 17 represents a conductive light shielding formed between the first and second wiring layers 14 and 15, and reference numeral 18 represents a conductive light shielding formed between the second and third wiring layers 15 and 19. Of light shielding trains made of a plurality of light shieldings 16, 17 and 18, the light shielding trains formed on the same level wiring layer are disposed by shifting them by a half phase to improve the light shielding effect. Reference numeral 20 represents a third insulating layer above the second wiring layer 15. In this embodiment, the third wiring layer 19 supplies from an external terminal a power supply potential suitable for operating the MOS transistor contained in each unit pixel 9. The first and second wiring layers 14 and 15 supply from an external terminal a ground potential to the p-type semiconductor substrate 8. A contact hole 50 is used for establishing an electric contact to the source, drain or gate of at least one of a reset MOS transistor, amplification MOS transistor and select MOS transistor constituting each pixel.

In FIG. 6A, four pixels are shown among a plurality of unit pixels 9 disposed two dimensionally on the substrate of the photoelectric conversion device with a pixel area.

The numbers of control signal lines 12 and output signal lines 13 are not limited only to those shown, but they are determined as desired.

A method of forming the light shieldings 16, 17 and 18 of this embodiment is similar to that used for forming the light shielding 3 of the first to fourth embodiments. For example, the light shielding 16 is formed by planarizing the upper surface of the insulating layer 4 formed on the p-type semiconductor substrate 8, forming a fine hole through the insulating layer 4 by photolithography using a phase shift method and anisotropic etching, and filling the fine hole with refractory metal such as tungsten. The light shielding 16 also serves as a member formed in a contact hole for electrically connecting the p-type semiconductor substrate 8 and first wiring layer 14.

The light shielding 17 is formed by a similar method, and serves also as a member formed in a through hole for electrically connecting the first and second wiring layers 14 and 15.

Similarly, the light shielding 18 serves also as a member formed in a through hole for electrically connecting the second and third wiring layers 15 and 19.

In this embodiment, therefore, the light shieldings 16, 17 and 18 formed in respective layers provide both a function of shielding oblique light and a function of serving as members formed in the contact hole and through holes.

If there are wiring layers applied with different potentials as in this embodiment, it is necessary to use the layout shown in FIGS. 6B and 6C. Referring to FIG. 6C, if the light shielding 18 is formed between the second wiring layer 15 and third wiring layer 19, the third wiring layer 19 and p-type semiconductor substrate 8 are electrically shorted. It is however desired to form the light shieldings between all wiring layers in order to shield oblique light. From this reason, as shown in FIG. 6B, the second wiring layer 15 is separated into a wiring layer to which a power supply potential is supplied from the third wiring layer and a wiring layer for supplying a ground potential to the p-type semiconductor substrate 8. The light shielding 18 is formed between the third wiring layer 19 and the separated wiring layer of the second wiring layer 15 for supplying the power supply potential, whereas the light shielding 17 is formed between the first wiring layer 14 and the separated wiring layer of the second wiring layer 15 for supplying the ground potential to the p-type semiconductor substrate 8. In this manner, without electrically connecting the wiring layers applied with different potentials, oblique light can be shielded.

However, this layout broadens the light shielding area. Therefore, by considering a balance between the light shielding ability of the light shielding area and the opening ratio, the light shielding 18 may not be formed as shown in FIG. 6C.

In the photoelectric conversion device of this embodiment, as shown in FIG. 6A, light shieldings 16, 17 and 18 are not disposed in the area through which the control signal lines 12 and output signal lines 13 pass. Namely, the light shielding groups made of a plurality of light shieldings 16, 17 and 18 is intermittently formed and do not completely surround the light reception area as in the fifth embodiment. Therefore, the phrase "surrounding the light reception area" used in this specification is intended to include the case that a plurality of light shielding groups surround the light reception area 30 in the above-described manner.

In this embodiment, although upper and lower light shieldings formed between upper and lower wiring layers are formed by shifting them by a half phase, the phase may not be shifted. If light shieldings are formed without shifting the phase, the area occupied by the light shielding area can be reduced.

A unit pixel used by the invention is a single photodiode, a single photo transistor or the like, or a single photodiode, a single photo transistor added with a reset, amplification or select transistor.

A light shielding used by the invention is made of light absorbing or reflecting material. As a material of a conductive light shielding, it is preferable to use conductive material containing at least one metal selected from a metal group consisting of aluminum, tungsten, titanium, tantalum, copper, molybdenum and cobalt. As a material of an insulating light shielding, it is preferable to use insulating material containing at least one insulator selected from an insulator group consisting of acrylic resin, epoxy resin, amide resin, phenol resin, and polystyrene resin.

As a material of the insulating layer in which the light shielding is formed, it is preferable to use material containing at least one of inorganic insulating material such as silicon oxide and silicon nitride which is either non-doped or doped with boron, phosphorous or fluorine and organic insulating material such as polyarylether.

An example of a light shielding manufacture method will be described. First, the surface of an insulating layer formed by coating or CVD is planarized, if necessary, by etching or CMP. Photoresist is coated on the surface of the insulating layer, and a photoresist pattern for forming a square opening having one side of 0.4 $\mu$m or shorter is formed by photolithography using a phase shift mask, and as a light source, i-rays, KeF excimer laser, ArF excimer later, F2 excimer laser or the like. By using this photoresist pattern as a mask, the insulating layer is anisotropically etched through reactive ion etching using fluorine gas such as $CF_4$ to thereby form an opening.

If necessary, barrier metal such as Ti, TiN, Ta, TaN and WN is deposited by CVD or sputtering. Thereafter, metal such as Al, W and Cu is deposited by CVD, sputtering or plating. If necessary, unnecessary portions of the deposited metal are removed by etching or CMP so that the opening in the insulating layer can be filled with the light shielding.

An example of manufacturing a photoelectric conversion device according to an embodiment of the invention will be described.

Figure 9A:
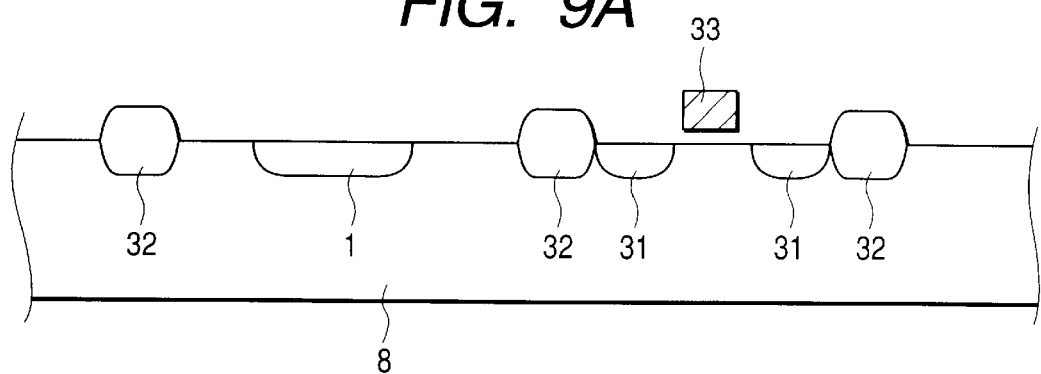
FIGS. 9A, 9B and 9C are schematic cross sectional views illustrating a manufacture method for a photoelectric conversion device of this invention.

As shown in FIG. 9A, formed on the surface of a semiconductor substrate 8 are an element separation region 32 made of silicon oxide, a photoelectric conversion region 1, source/drain diffusion regions 31, and a gate electrode 33 of a MOS transistor constituting a pixel.

Figure 9B:
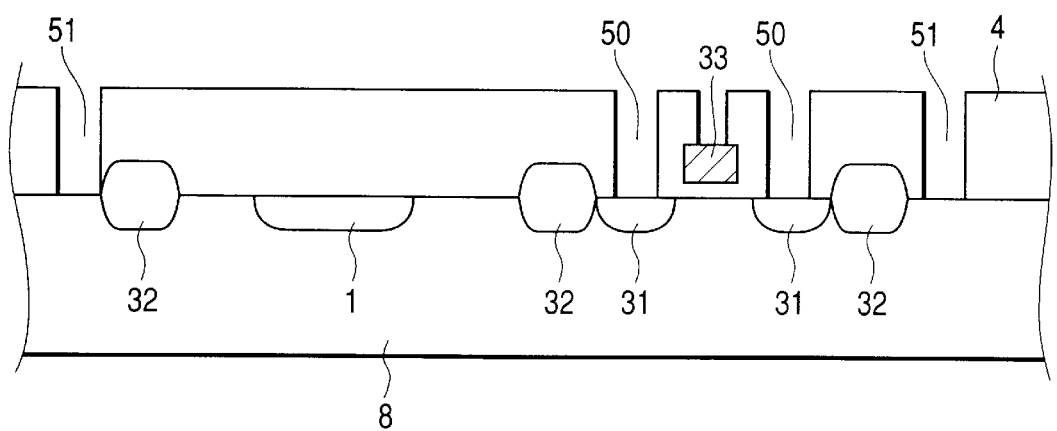

As shown in FIG. 9B, an insulating layer 4 is formed on the surface of the semiconductor substrate 8 to a thickness of about 100 nm to 5 $\mu$m by a method described earlier.

Contact holes 50 for the gate electrode and source/drain regions of a transistor and a light shielding recess 51 in which the light shielding 16 is filled, are formed by the same process, in a manner described earlier.

Figure 9C:
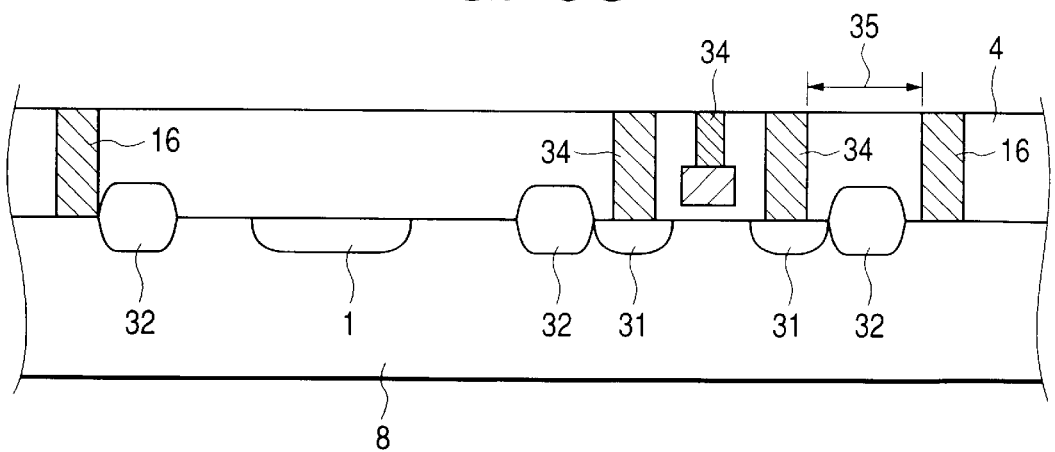

As shown in FIG. 9C, metal is deposited in the contact holes 50 and recess 51 by a method described earlier to form the light shielding 16 and conductive members 34 to be connected to the gate electrode and source/drain regions of the transistor, by the same process.

With this manufacture method, as shown in FIG. 9C, a space 35 between the light shielding 16 and nearest conductive member 34 formed by the same process can be designed to a minimum size allowable by photolithography using a phase shift mask.

A phase shift mask usable by the invention may be a Levenson type, a half tone type or the like.

Next, with reference to FIG. 7, an embodiment will be described in which a photoelectric conversion device is applied to an image pickup apparatus such as a still camera.

Figure 7:
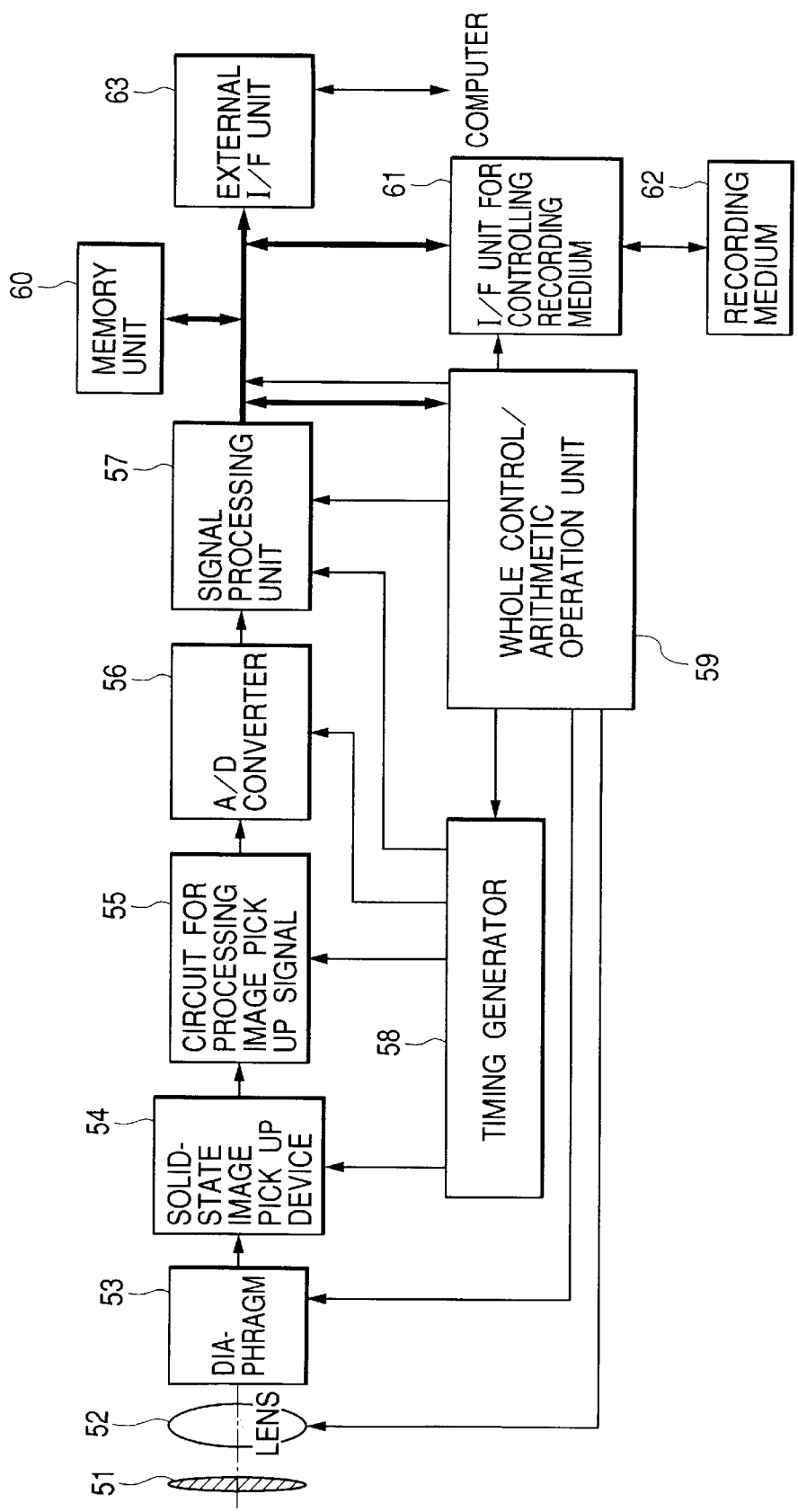
FIG. 7 is a diagram showing an image pickup apparatus to which a photoelectric conversion device is applied, according to another embodiment of the invention.
Figure 8A:
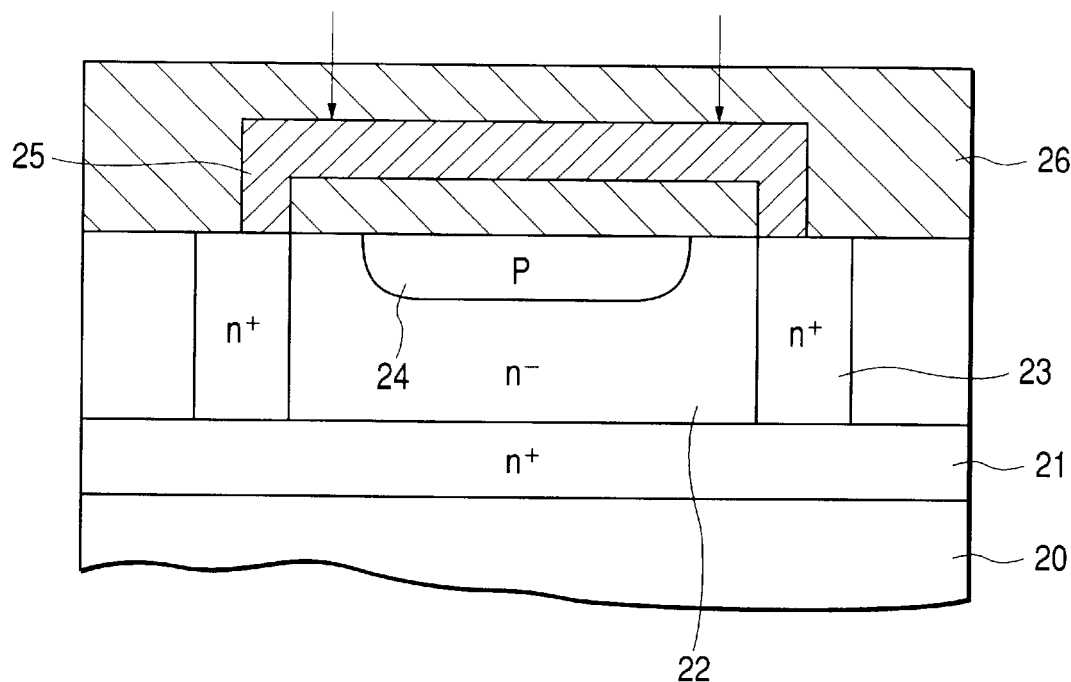
FIG. 8A is a cross sectional view of a photoelectric conversion device according to prior art.
Figure 8B:
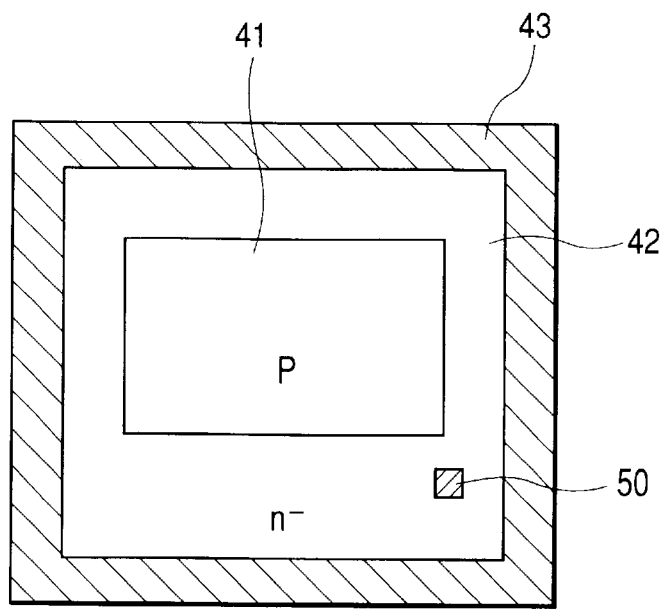
FIG. 8B is a schematic top view of another photoelectric conversion device according to prior art.

Referring to FIG. 7, reference numeral 51 represents a barrier functioning both as a protector of a lens and as a main switch. Reference numeral 52 represents a lens for focussing an optical image of a subject upon a solid state image pickup device. Reference numeral 53 represents a diaphragm for changing the amount of light passed through the lens 52. The solid state image pickup device 54 or photoelectric conversion device of this invention converts a subject image focussed by the lens 52 into an image signal. Reference numeral 55 represents an image signal processing circuit for making the image signal output from the solid state image pickup device 54 be subjected to various corrections, clamping and the like. Reference numeral 56 represents an A/D converter for converting an analog image signal output from the solid state image pickup device 54 into a digital image signal. Reference numeral 57 represents a signal processing unit for making image data output from the A/D converter 56 be subjected to various corrections and data compression. Reference numeral 58 represents a timing signal generator unit for outputting various timing signals to the solid state image pickup device 54, image signal processing circuit 55, A/D converter 56 and signal processing unit 57. Reference numeral 59 represents a (whole) control/arithmetic operation unit for performing various arithmetic operations and controlling the whole of the image pickup apparatus. Reference numeral 60 represents a memory unit for temporarily storing image data. Reference numeral 61 represents an interface unit for transferring data to and from a recording medium 62. The recording medium 62 is a removable recording medium such as a semiconductor memory for storing image data. Reference numeral 63 represents an interface unit for communicating with an external computer or the like.

Next, the image pickup operation of the image pickup apparatus constructed as above will be described.

As the barrier 51 is opened, a main power source is turned on, then a control series power source is turned on, and lastly a power source for image pickup circuits such as the A/D converter 56 is turned on. Next, in order to control the exposure amount, the control/arithmetic operation unit 59 opens the diaphragm 53, and a signal output from the solid state image pickup device 54 is converted into a digital signal by the A/D converter 56 and input to the signal processing unit 57.

According to the signal input to the signal processing unit, the control/arithmetic operation unit 59 calculates an exposure amount. After this photometry, the brightness of the subject is judged and in accordance with this judgement, the control/arithmetic operation unit 59 controls the diaphragm.

Next, high frequency components contained in a signal output from the solid state image pickup device 54 are removed and the control/arithmetic operation unit 59 calculates a distance to the subject. The lens is then driven and it is checked whether the lens is in-focus or not. If it is judged that the lens is not in-focus, the lens is again driven to perform range finding. After the in-focus is confirmed, the actual exposure starts.

After the exposure, an image signal output from the solid state image pickup device 54 is converted into a digital image signal by the A/D converter 56 and supplied to the signal processing unit 57. A signal output from the signal processing unit 57 is written in the memory unit 60 under the control of the control/arithmetic operation unit 59.

Thereafter, the data stored in the memory unit 60 is recorded via the recording medium control I/F unit 61 into the removable recording medium 62 such as a semiconductor memory, under the control of the control/arithmetic operation unit 59. The data stored in the memory unit 60 may be input to a computer via the external I/F unit 63 to be processed.

As described so far, according to the invention, problems such as malfunction and image quality deterioration of the photoelectric conversion device to be caused by oblique light can be solved without increasing a chip size. The effects of the invention are not limited only to when a method of forming a light shielding according to the embodiment is used, but the effects become considerable particularly when a method of forming a fine light shielding whose shape is restricted is used.

What is claimed is:

1. A photoelectric conversion device comprising:

a substrate;

a light reception area formed on a surface of said substrate, said light reception area having at least one unit pixel;

a plurality of insulating layers and wiring layers alternately laminated in this order on said substrate; and a light shielding group made of a plurality of analogous light shieldings, wherein some of said light shieldings are formed in contact holes formed in said insulating layer between said substrate and a lowermost wiring layer among said plurality of wiring layers, and some of said light shieldings are formed in through-holes formed in said insulating layers between said plurality of wiring layers, wherein said plurality of light shieldings electrically connect said substrate to said lowermost wiring layer, and electrically connect said plural wiring layers mutually, and have both an electrical function of supplying a ground potential to said substrate and another electrical function of supplying a source voltage, and wherein said light shielding group surrounds said unit pixel or said light reception area.

2. A photoelectric conversion device according to claim 1, wherein said light shielding group has light shielding trains made of a plurality of light shieldings disposed periodically.

3. A photoelectric conversion device according to claim 2, wherein the plurality of light shieldings are disposed at different phases.

4. A photoelectric conversion device according to claim 1, wherein the plurality of light shieldings are disposed between adjacent unit pixels.

5. A photoelectric conversion device according to claim 1, wherein said light reception area has at least one dark pixel for outputting a dark reference output.

6. An image pickup apparatus comprising:

a photoelectric conversion device according to any one of claims 1 to 5;

a lens for focussing light upon said photoelectric conversion device;

a signal processing unit for processing a signal supplied from said photoelectric conversion device; and a timing signal generator unit for generating timing signals for controlling said photoelectric conversion device and signal processing unit.

7. A photoelectric conversion device according to claim 1, wherein the plurality of light shieldings are formed by utilizing a phase shift method.

8. A photoelectric conversion device according to claim 1, wherein the unit pixel has at least one transistor, and the transistor is connected to a conductive member formed by a same process as used for forming the plurality of light shieldings.

9. A photoelectric conversion device according to claim 8, wherein the the plurality of light shieldings and the conductive member are formed by a phase shift method.

10. A photoelectric conversion device according to claim 8, wherein said light shielding group is intermittently formed without passing through an area where at least one of control signals or output signals connected to the transistor is formed.

* * * * *

UNITED STATES PATENT AND TRADEMARK OFFICE
CERTIFICATE OF CORRECTION

PATENT NO. : 6,653,617 B2
DATED : November 25, 2003
INVENTOR(S) : Hiroki Hiyama et al.

It is certified that error appears in the above-identified patent and that said Letters Patent is hereby corrected as shown below:

Column 1,
Line 17, "in" should be deleted; and
Line 65, "at" should be deleted.

Column 2,
Line 18, "is" (second occurrence) should be deleted; and
Line 20, "at" should be deleted.

Column 3,
Line 21, "of" should be deleted.

Column 5,
Line 34, "entered" should read -- entering --; and
Line 65, "the number" should read -- as the number --.

Column 6,
Lines 17 and 21, "at" should be deleted.

Column 8,
Line 20, "later," should read -- laser, --.

Column 10,
Line 41, "claims 1 to 5;" should read -- claims 1 to 4; --.

Signed and Sealed this

Eleventh Day of May, 2004

JON W. DUDAS
*Acting Director of the United States Patent and Trademark Office*